United States Patent [19]
Ansel et al.

[11] Patent Number: 5,751,644
[45] Date of Patent: May 12, 1998

[54] DATA TRANSITION DETECT WRITE CONTROL

[75] Inventors: George M. Ansel, Starkville; Jeffery Scott Hunt, Ackerman; Ping Wu, Starkville; David A. Lindley, Starkville; Andrew L. Hawkins, Starkville, all of Miss.

[73] Assignee: Cypress Semiconductor Corporation, San Jose, Calif.

[21] Appl. No.: 756,634

[22] Filed: Nov. 26, 1996

[51] Int. Cl.[6] ............................ G11C 11/407; B01F 7/00
[52] U.S. Cl. .................... 365/194; 365/233.5; 365/233; 365/189.05; 365/194; 365/191
[58] Field of Search ................... 365/189.01, 194, 365/230.01, 233.5, 233, 189.05, 191; 327/291, 295

[56] References Cited

U.S. PATENT DOCUMENTS

| | | | |
|---|---|---|---|
| 5,305,268 | 4/1994 | McClure | 365/203 |
| 5,384,745 | 1/1995 | Konishi et al. | 365/230.03 |
| 5,404,327 | 4/1995 | Houston | 365/203 |
| 5,631,871 | 5/1997 | Park et al. | 365/203 |

*Primary Examiner*—Viet Q. Nguyen
*Attorney, Agent, or Firm*—Bliss McGlynn, P.C.

[57] ABSTRACT

The present invention concerns data transition method and apparatus for driving a set of write data signals to an inactive (or deasserted) state upon completion of a WRITE to a particular group of memory cells. The present invention drives the write data signals to a an inactive state to end a WRITE without waiting for the end of the write control pulse. The present invention triggers a group of data write buffers to drive one of the write data signals to a "0" at the beginning of the WRITE control pulse or at a data input transition during a WRITE. A delayed transition of the write data signals may be used to drive both the write data signals to a "1"[ t]o end the WRITE within a particular memory group. The write data transition detection is accomplished at the write data inputs of the groups of memory cells without relying on global chip data input pin transition detection and pulse width setting. The data setup to the end of WRITE is generally not compromised since the path from chip data input to the input to the write data signals is generally similar to existing implementations.

20 Claims, 3 Drawing Sheets

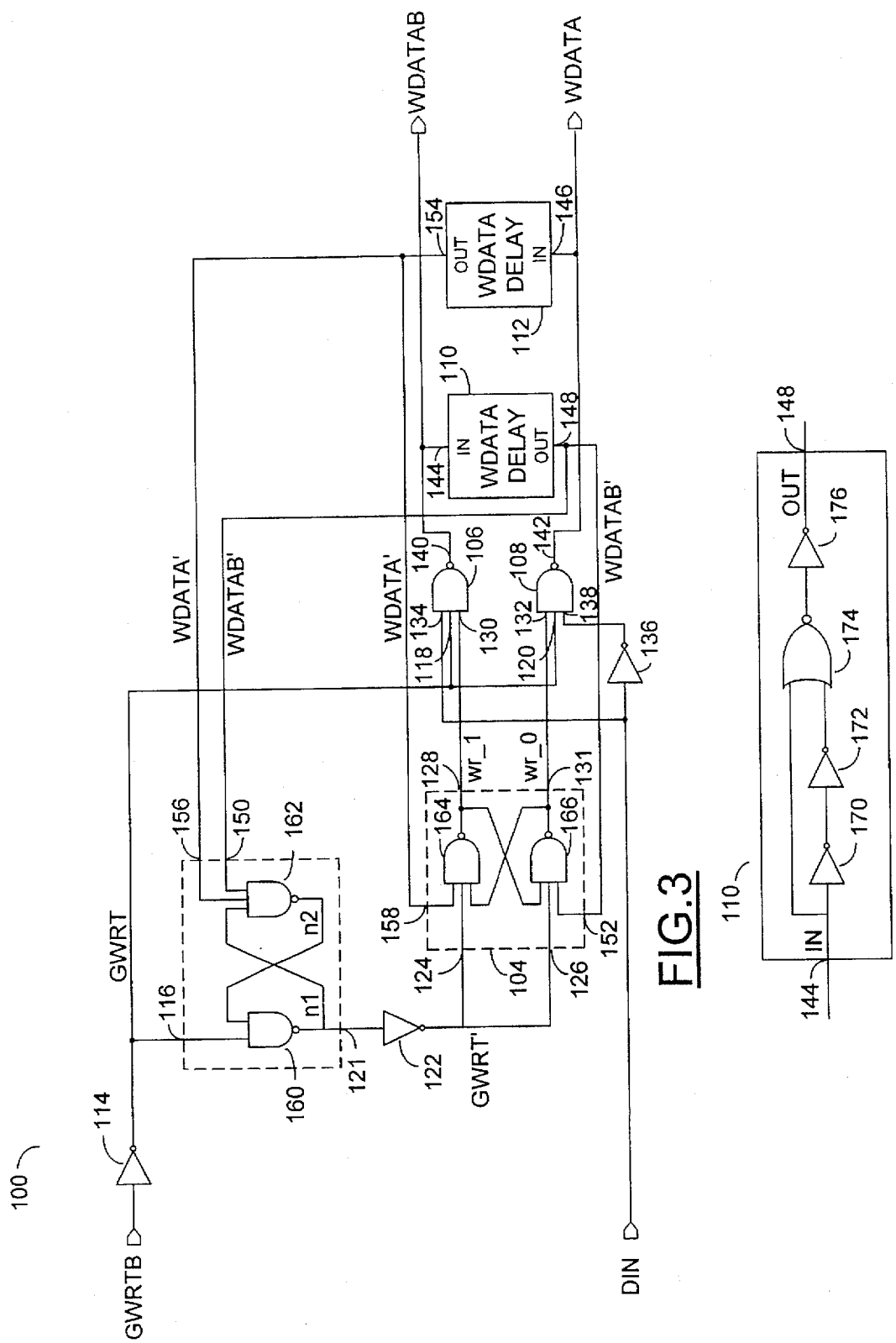

DATA TRANSITION DETECT WRITE CONTROL

FIELD OF THE INVENTION

The present invention relates to write control signals generally and, more particularly, to a data transition detect write control signal.

BACKGROUND OF THE INVENTION

A circuit comprising delay blocks may be used in a write control circuit to delay the start of WRITE for the address setup for write $t_{SA}$ and speed the end of WRITE for the address hold at the end of WRITE $t_{HA}$. The address hold at the end of WRITE $t_{HA}$ ensures that the address does not change before the internal write control is deactivated. This ensures that the WRITE does not change the contents of the wrong memory cell. The address input delays may be designed to trade-off between the address setup for WRITE $t_{SA}$, the address hold at the end of WRITE $t_{HA}$ and the address access time $t_{AA}$a. A relatively fast signal may be derived from the WRITE enable input to drive both the signals WDATA and WDATAB to the memory array to a high level (i.e., a "1"), to speed completion of the WRITE before an address transition occurs. Driving both WDATA and WDATAB to "1", or inactive state, prevents disturb of data in memory cells not selected for the WRITE.

Referring to FIG. 1, a circuit 10 implementing a trade-off architecture is shown. The circuit 10 generally comprises a write control block 12, an address decode and delay block 14, a block write control 16, a block write control 18, a write data driver 20 and a write data driver 22. The write control block 12 has an input 24 that receives a write enable bar signal WEB. The address decode and delay block 14 has an input 26 that receives address information. The write control block 12 presents a first output 28 that represents a fast control end WRITE signal and a second output 30 that represents a slow control begin write signal. The fast control end WRITE signal is presented to an input 32 of the block write control 16 and an input 34 of the block write control 18. The slow control begin WRITE signal is presented to an input 36 of the block write control 16 and an input 38 of the block write control 18.

The address decode and delay block 14 presents an output 40 to an input 42 of the block write control 16 and an input 44 of the block write control 18. The block write control 16 presents a signal at an output 46 to an input 48 of the write data driver 20. Similarly, the block write control 18 presents a signal at an output 50 to an input 52 of the write data driver 22. A data in signal DIN is presented to an input 54 of the write data driver 20 and an input 56 of the write data driver 22. The write data driver 20 presents an output 60 and an output 62 that represent the signals WDATA and WDATAB that are generally presented to a block 0. Similarly, the write data driver 22 presents an output 64 and an output 66 that represent the signals WDATA and WDATAB that are generally presented to the block 1.

The circuit as illustrated in FIG. 1 has the disadvantage of requiring multiple paths from the write control outputs of the global write control circuit. Additionally, the scheme also requires a trade-off between the parameters $t_{SA}$, $t_{HA}$ and $t_{AA}$.

A second previous approach scheme (similar to U.S. Pat. No. 5,305,268 and 5,404,327) detects a transition at the input data pins and generates an internal WRITE pulse whenever an input data pin changes state during a WRITE operation. Referring to FIG. 2, a circuit 10' implementing the second previous approach is shown. The write control block 12 presents a single output 28 representing an internal write enable pulse. The output 28 is generally presented to an input 32 of the block write control 16 and to an input 34 of the block write control 18. The address decode block 14 presents the signal at the output 40 to the input 42 of the block write control 16 as well as to the input 44 of the block write control 18. A data transition detect block 70 receives an input 72 from a first data in pin and an input 74 from a second data in pin. The data in signal is also presented to an input 54 of the write data driver 20 and an input 56 of the write data driver 22.

The alternate circuit 10' generates an internal WRITE pulse based on either the beginning of a WRITE or an input data transition during a WRITE condition. The alternate circuit 10' relies on circuitry external to the memory blocks to generate the WRITE pulse of a proper duration. At the end of the internal WRITE pulse, the signals WDATA and WDATAB presented to the memory array are driven to a 1, or high, state to terminate the write. This allows the difference of $t_{SD}$ and the internal WRITE pulse to be used for recovery of the memory bitlines to a 1.

The circuit as illustrated in FIG. 2 has the disadvantage of requiring a global transition detect that is not-specific to a particular memory cell or group of memory cells. The end of WRITE must be predetermined based on the worst case conditions and is not dependent on the timing of signals driving the cells of the memory array.

SUMMARY OF THE INVENTION

The present invention concerns data transition method and apparatus for driving a set of write data signals to an inactive (or deasserted) state upon completion of a WRITE to a particular group of memory cells. The present invention drives the write data signals to an inactive state to end a WRITE without waiting for the end of the write control pulse. The present invention triggers a group of data write buffers to drive one of the write data signals to a "0" at the beginning of the WRITE control pulse or at a data input transition during a WRITE. A delayed transition of the write data signals may be used to drive both the write data signals to a "1" to end the WRITE within a particular memory group. The write data transition detection is accomplished at the write data inputs of the groups of memory cells without relying on global chip data input pin transition detection and pulse width setting. The data setup to the end of WRITE is generally not compromised since the path from chip data input to the input to the write data signals is generally similar to existing implementations.

The objects, features and advantages of the present invention include providing a circuit that provides an end of WRITE to trigger a group of data buffers, maintains a large margin to data setup time, provides sufficient time to allow the write data signals to transition to a one before the next address change, provides an end of WRITE for each particular cell in the array based on actual conditions, does not require worst case assumptions and does not rely on global data transition detection to end the WRITE.

BRIEF DESCRIPTION OF THE DRAWINGS

These and other objects, features and advantages of the present invention will be apparent from the following detailed description and the appended claims and drawings in which:

FIG. 3 is a diagram illustrating a preferred embodiment of the present invention;

FIG. 4 is a detailed diagram of a delay block of the present invention; and

DETAILED DESCRIPTION OF THE PREFERRED EMBODIMENTS

Figure 1:
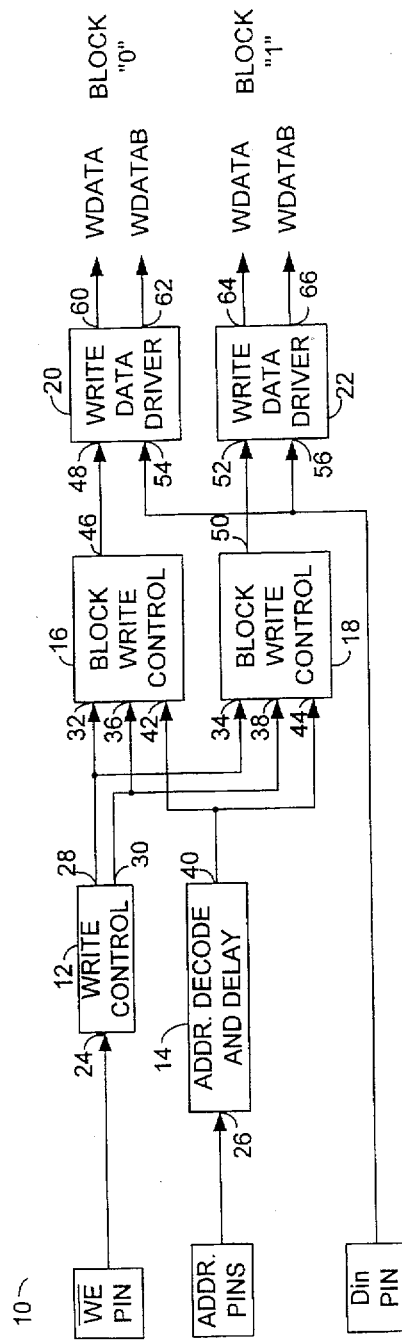
FIG. 1 is a block diagram of a previous approach write control circuit.
Figure 2:
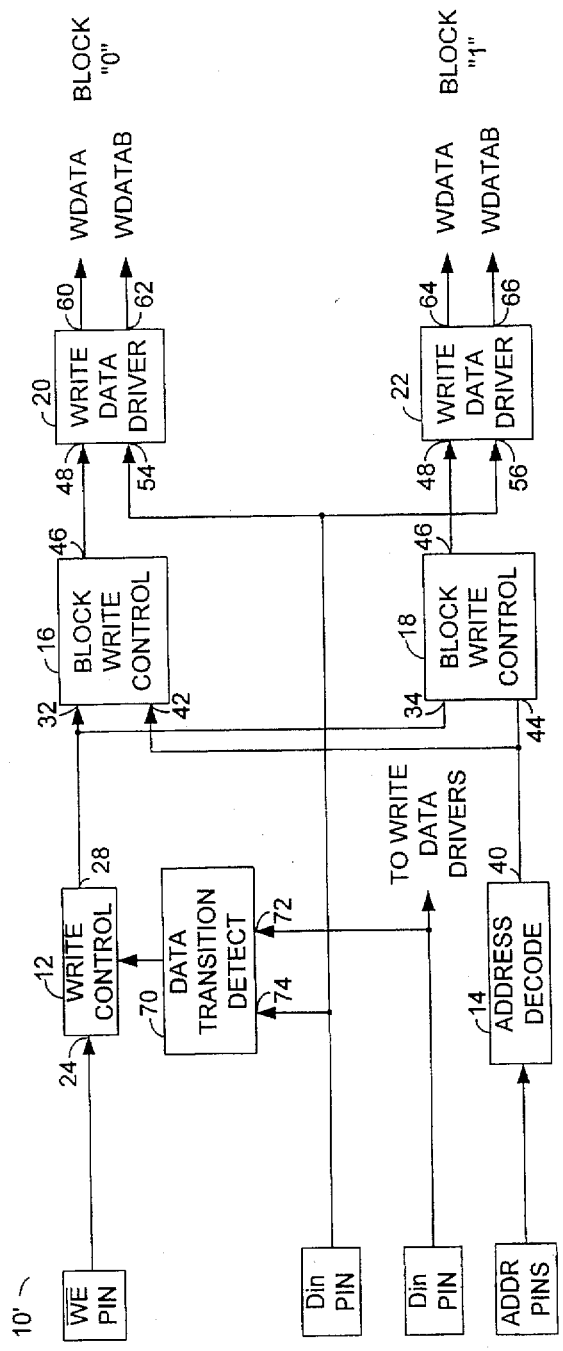
FIG. 2 is an alternate embodiment of a previous approach write control circuit.

Referring to FIG. 3, a circuit 100 is shown in accordance with a preferred embodiment of the present invention. The circuit 100 generally comprises a block 102, a block 104, a gate 106, a gate 108, a delay block 110 and a delay block 112. A group write bar signal GWRTB is generally presented to an inverter 114 that presents a group write signal GWRT to an input 116 of the block 102 as well as to an input 118 of the gate 106 and to an input 120 of the gate 108. An output 121 of the block 102 presents a signal, through an inverter 122, to an input 124 and to an input 126 of the block 104. An output 128 of the block 104 generally presents a write enable signal WR_1 to an input 130 of the gate 106. Similarly, an output 131 of the block 104 generally presents a write enable signal WR_0 to an input 132 of the gate 108.

A signal DIN is a data input signal that is generally presented to an input 134 of the gate 106 as well as to an inverter 136. The output of the inverter 136 is generally presented to an input 138 of the gate 108. An output 140 of the gate 106 represents a write data signal WDATAB. An output 142 of the gate 108 represents a write data signal WDATA. The write data signals WDATA and WDATAB represent signals that are generally gated by the write pass gates (not shown) to control writing to the memory array (not shown). The write data signals WDATA and WDATAB, in one example, may be active low signals. The output 140 is also generally presented to an input 144 of the delay block 110. The output 142 may also be presented to an input 146 of the delay block 112. An output 148 of the delay block 110 generally presents a signal WDATAB' to an input 150 of the block 102 as well as to an input 152 of the block 104. An output 154 of the delay block 112 generally presents a signal WDATA' to an input 156 of the block 102 as well as to an input 158 of the block 104.

The block 102 generally comprises a gate 160 and a gate 162. The output of the gate 160 is generally represented as a node N1. The output of the gate 162 is generally represented as a node N2. The gate 160 generally receives a first input from the input 116 and a second input from the node N2. The gate 162 generally receives a first input from the input 150, a second input from the input 156 and a third input from the node N1. The gate 160 and the gate 162 are generally implemented as NAND gates. However, other combinations of gates may be implemented to provide a set and reset or a set bar and reset bar latching function. The block 102 generally sets the state of the block 104 so that both the write enable signals WR_0 and WR_1 are active at the beginning of WRITE. This allows the first WRITE to drive either the write data signal WDATA or WDATAB low. After this occurs, the block 102 is generally reset and the block 104 generally controls the write data signals WDATA and WDATAB until the global write signal GWRTB is deactivated.

The block 104 generally comprises a gate 164 and a gate 166. The gate 164 generally receives a first input representing the signal WDATA', a second input representing the signal GWRT' and a third input from the gate 166. The gate 166 generally has a first input from the gate 164, a second input representing the signal GWRT' and a third input representing the signal WDATAB'. The gate 164 and the gate 166 are shown generally implemented as NAND gates. However, other gates may be used that in combination provide a set and reset or set bar and reset bar latching function.

The block 104 generally presents the write enable signals WR_1 and WR_0 in response to the write data signal WDATAB', the write data signal WDATAB and the signal GWRT'. The amount of delay presented from the delay blocks 110 and 112 determines the delay in the signals WDATA' and WDATAB' which in turn determines the delay in the signals WR_1 and WR_0. The delay blocks 110 and 112 should generally be designed to provide a proper amount of delay such that the end of WRITE signal is provided accordingly. The block 104 generally prevents the memory array from continuing to write the same data. For example, if a "0" is written to the memory array, the write data signal WDATA is generally low and the write data signal WDATAB would generally be high. The delayed write data signals WDATA' and WDATAB' would then reset the block 104 to a state where the next write must be a "1". The block 104 generally stores the last state of the write data signals WDATA and WDATAB for a comparison to detect a transition on the data input line DIN during a write to the particular memory group (i.e., the signal GWRTB is generally active).

Referring to FIG. 4, a more detailed diagram of the delay block 110 is shown. The delay block 112 is generally implemented similarly to the delay block 110. The delay block 110 is shown generally comprising an inverter 170, an inverter 172, a NOR gate 174 and an inverter 176. The input 144 is generally presented to the inverter 170 and to the NOR gate 174. An output of the inverter 170 is generally presented to the inverter 172 which presents an output to the NOR gate 174. The output of the NOR gate 174 is generally presented to the output 148 through the inverter 176. As a result, the delay block 110 generally presents a fixed amount of delay between the input 144 and the output 148. The delay block 110 may be implemented as any delay which provides a fixed amount of delay between the transition between a one and a zero. It may not be required to delay the transition between a zero and a one. In addition, a variable or programmable delay may be implemented in place of the delay block 110. The delay block 110 may be implemented as a memory cell to provide the appropriate delay. If the delay block 110 is implemented as a memory cell, an additional advantage of verifying that data can actually be written to the memory array may be realized since actual data has been written to a memory cell (i.e., the memory cell of the delay block 110).

If the delay block 110 and the delay block 112 are implemented as a programmable delay, the circuit 100 may be adjusted after the fabrication process in order to meet particular design specifications. Additionally, with the implementation of a programmable delay, the circuit 100 may be designed closer to the fabrication tolerances since the programmable delay elements 110 and 112 may be adjusted after the fabrication process. Additionally, the implementation of programmable delay elements 110 and 112 may be used as a design tool to test the fabrication process by designing for aggressive tolerances and then increasing the delay until the circuit 100 functions properly.

Figure 5:
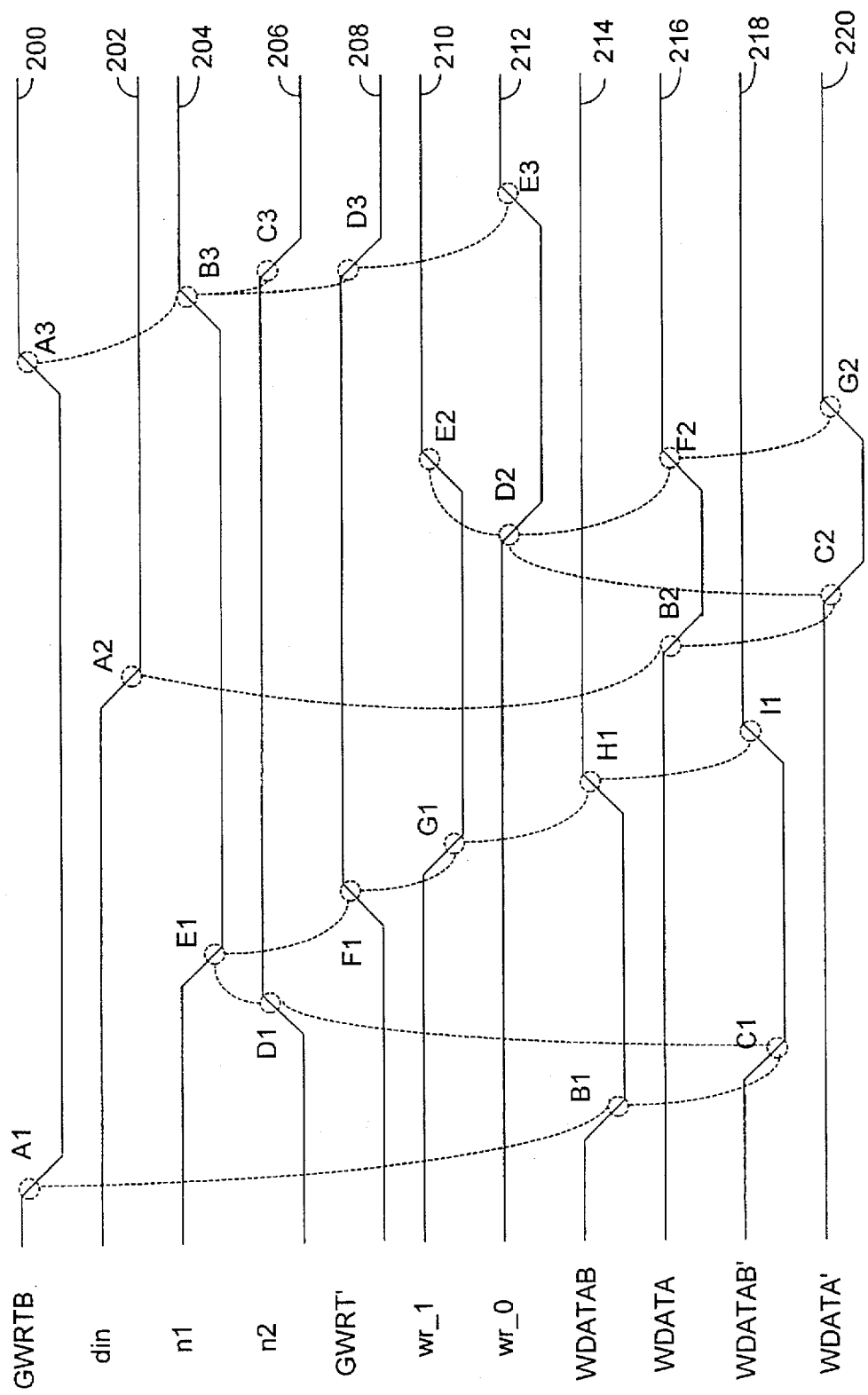
FIG. 5 is a timing diagram of the various nodes of the preferred embodiment of the present invention.

Referring to FIG. 5, a timing diagram of various nodes of the circuit 10 is shown. The signal GWRTB is generally shown as a waveform 200, the signal DIN is generally shown as a waveform 202, the node N1 is generally shown as a waveform 204, the node N2 is generally shown as a waveform 206, the signal GWRT' is generally shown as a waveform 208, the write enable signal WR_1 is generally shown as a waveform 210, the write enable signal WR_0 is generally shown as a waveform 212, the signal WDATAB is generally shown as a waveform 214, the signal WDATA is generally shown as a waveform 216, the signal WDATAB' is generally shown as a waveform 218 and the signal WDATA' is generally shown as a waveform 220. The timing diagram of FIG. 5 generally illustrates the case of writing a "1" to the memory array at the beginning of WRITE, followed by changing the state of the data input signal DIN to write a "0" during the WRITE.

Generally, when writing a particular state to the memory array, the signal GWRTB transitions low at a time A1, which is an active state. In response, the signal GWRT will transition high. While signal GWRTB was high, the block 104 was set to a state where N1 is high. In response, the signal GWRT' is low indicating that the write enable signals WR_1 and WR_0 are both at a high thus enabling writing either a "1" or a "0" to the memory array depending on the state of the data input signal DIN. Additionally, when the signal GWRTB is high, the signal GWRT is low so that both the write data signals WDATA and WDATAB are generally driven high by the NAND gates 106 and 108.

When the signal GWRTB transitions low, the signal GWRT transitions high. When the signal GWRT transitions high, either the signal WDATA or WDATAB is generally driven low by the NAND gates 108 or 106 depending on the state of the data input signal DIN. The signals GWRT and GWRT' generally trigger the next event. When the signal GWRTB transitions low, the signal WDATAB generally transitions low when a one is written to the memory array (i.e., timing point B1). When the signal WDATAB transitions low, the signal WDATAB' transitions low after the delay is satisfied (i.e., timing point C1) which generally resets the block 102 to the state where the node N2 is generally high and the node N1 is generally low (i.e., timing points D1 and E1). The signal GWRT' is in the proper state (high) allowing the block 104 to be reset.

At the time E1, data has generally been written to the memory cell. Since the write data signal WDATAB was a "0", a "1" was generally written. At the time E1, the latch 102 is generally reset and the node N1 generally causes transition on the node GWRT', causing a "1" to be generally presented to the inputs of the gates 164 and 166. The signal WDATAB' is generally a "0" which generally sets the latch 104 to detect a data transition during a WRITE. The next state that may be written to the array is "0". Since the signal WDATAB' is a "0", the signal WR_0 is generally set to a "1" and the signal WR_1 is generally set to a "0". In this state, the only data that can be written is a "0" since gate 106 generally has a "0" on one input 130 (which is the signal WR_1) and the gate 108 generally has a "1" on the input 132 (which is the signal WR_DM0). The gates 104, 106 and 108 are generally configured to detect a data transition during a write that generally occurs at time A2.

The end of the first WRITE (triggered by the high to low transition of GWRTB) occurs in FIG. 5 at the time H1. The block 102 is now set in a state that generally only allows the signals WDATA or WDATAB to be driven low when the data input DIN changes state. Referring to FIG. 5, the next thing that happens at the time A2 is that the data input DIN changes state during a write. After this transition, the signal WDATA is driven low at time B2 since a zero is written to the memory array.

At time A2 there is generally a transition on the data input line DIN from a "1" to a "0". The "1" to "0" transition on the data input line DIN generally causes the input 138 of gate 108 to transition from a "0" to "1". This makes the output 142 of gate 108 transition from a "1" to a "0" at time B2 since the gate 108 has a "1" on the write enable signal WR_0 and the GWRT input is a "1". After the delay through element 112, the WDATA' line transitions from "1" to "0" at the time C2. When the signal WDATA' transitions from a "1" to a "0" (at the time C2) the latch 104 is generally reset through the gate 164. The signal WDATA resets the latch 104 so that at time D2 the signal WR_0 transitions to a "0". At the time E2 the signal WR_1 transitions to a "1". The next data transition that can be written to the array is a "1" because signal WR_1 is a "1" and the signal WR_0 is a "0". Generally, the transition of the signal WR_0 to a "0" at time D2 forces the signal WDATA to a "1" through gate 108 at the time F2, thus ending the WRITE. The time between the time F2 and the time G2 is generally the delay for the write data delay element 110.

The time A3 is basically the end of WRITE at which time the circuit is set up for the next WRITE. At the time A3 the signal GWRTB is generally deactivated which may force the signal GWRT to a "0" (or an inactive state). When the signal GWRT transitions to "0", the latch 102 is reset so that the node N1 transitions to a "1" at the time B3. The transition of the latch 102 propagates through the gate 162 to force the node N2 to a "0" at the time C3. When the node N1 transitions to a "1" at the time B3, the signal GWRT' transitions to a "0" at the time D3. When the signal GWRT' transitions to a "0", the inputs of both the gates 164 and 166 transition to a "0" which generally forces the signals WR_1 and WR_0 to a "1" at the time E3. The transition at the time E3 is only at the signal WR_0 because the signal WR_1 was already at a "1" for the example shown in FIG. 5.

At the end of WRITE, the block 104 is generally set to the state to detect the first write. Specifically, the node N1 would be a high and the node N2 would be low. As a result, the signal GWRT' is a low at time D3 which forces both of the write enable signals WR_1 and WR_0 to a high.

While the invention has been particularly shown and described with reference to the preferred embodiments thereof, it will be understood by those skilled in the art that various changes in form and details may be made without departing from the spirit and scope of the invention.

We claim:

1. A circuit comprising:
    a gate circuit configured to present one or more control signals in response to one or more write enable signals, wherein said one or more control signals transition to an inactive state after completion of a write operation without waiting for an end of write signal;
    a latch circuit configured to present said one or more write enable signals to said gate circuit in response to (i) an input and (ii) one or more delay signals; and
    a delay circuit configured to present said one or more delay signals in response to said one or more control signals.

2. The circuit according to claim 1 wherein said gate circuit generates said one or more control signals in further response to a data input signal.

3. The circuit according to claim 2 wherein said gate circuit comprises first and second gates, wherein said first gate receives said data input signal and said second gate receives the complement of said data input signal.

4. The circuit according to claim 1 further comprising a second latch circuit configured to present said input in response to (i) a group write signal and (ii) said one or more delay signals.

5. The circuit according to claim 4 wherein said first and second latch circuits each comprise a set/reset latch.

6. The circuit according to claim 1 wherein said delay circuit comprises a plurality of logic gates.

7. The circuit according to claim 1 wherein said delay circuit comprises a programmable delay element.

8. The circuit according to claim 7 wherein said delay circuit further comprises one or more memory cells.

9. The circuit according to claim 1 wherein said one or more control signals comprise write data signals.

10. A circuit comprising:

means for generating one or more control signals in response to one or more write enable signals;

means for presenting one or more signals to said generating means in response to (i) an input and (ii) one or more delay signals, wherein said one or more control signals transition to an inactive state after completion of a write operation in a memory; and delay means for presenting said one or more delay signals in response to said one or more control signals.

11. The circuit according to claim 10 wherein said generating means receives a data input signal.

12. The circuit according to claim 11 wherein said generating means comprises first and second gates, wherein said first gate receives said data input signal and said second gate receives an inverted data input signal.

13. The circuit according to claim 10 further comprising means for presenting said input in response to a second input and said one or more delay signals.

14. The circuit according to claim 13 wherein said means for presenting said one or more signals and said means for presenting said input each comprise a set/reset latch.

15. The circuit according to claim 10 wherein said delay means comprises a plurality of logic gates.

16. The circuit according to claim 10 wherein said delay means comprises a programmable delay element.

17. The circuit according to claim 16 wherein said delay means comprises one or more memory cells.

18. The circuit according to claim 10 wherein said one or more control signals comprise write data signals.

19. A method for producing signals to control the writing of a memory comprising the steps of:

(A) generating one or more write control signals to control the writing of the memory in response to a data input signal; and (B) deasserting said one or more write control signals after a after completion of a write operation in a memory.

20. The method according to claim 19 further comprises the step of:

presenting said data input signal to said memory in response to said one or more control signals.

* * * * *